United States Patent [19]
Harris

[11] Patent Number: 4,480,236
[45] Date of Patent: Oct. 30, 1984

[54] CHANNELIZED SERIAL ADAPTIVE FILTER PROCESSOR

[75] Inventor: Richard W. Harris, Bountiful, Utah

[73] Assignee: Sperry Corporation, New York, N.Y.

[21] Appl. No.: 394,486

[22] Filed: Jul. 1, 1982

[51] Int. Cl.³ .......................... H03H 7/01; H03H 7/46
[52] U.S. Cl. ..................................... 333/174; 328/167; 333/17 R; 333/166
[58] Field of Search ............. 333/166, 167, 174, 17 R, 333/165; 328/165, 167, 139; 364/819, 824, 825, 862

[56] References Cited
U.S. PATENT DOCUMENTS

| | | | |
|---|---|---|---|
| 3,375,451 | 3/1968 | Borelli et al. | 333/17 R X |
| 4,238,746 | 12/1980 | McCool et al. | 333/166 |
| 4,302,738 | 11/1981 | Cabot et al. | 333/17 R |

*Primary Examiner*—Marvin L. Nussbaum
*Attorney, Agent, or Firm*—John B. Sowell; Kenneth T. Grace; Marshall M. Truex

[57] ABSTRACT

A method and apparatus for eliminating narrow band noise and interference from a wide band signal while maintaining the wide band signal substantially intact.

8 Claims, 5 Drawing Figures

CHANNELIZED SERIAL ADAPTIVE FILTER PROCESSOR

BACKGROUND

1. Field of the Invention

This invention is directed to filter networks including adaptive filters, in general, and to such networks which are arranged in serial connection, in particular.

2. Prior Art

There are many applications in today's technology wherein a wide band signal is generated, such as frequency modulation and spread spectrum communication signals. However, such wide band signals are often subject to interference imposed by outside sources. This interference can be either deliberate or inadvertent. For example, in a deliberate interference case, a hostile entity may impose a jamming signal in an attempt to disrupt and interfere with the wide band signal and the information portrayed thereby. In the case of an inadvertent interference, the wide band signal may be generated in an area where a radio transmitter or the like is in operation. However, in each case, the interfering signal is typically of narrower bandwidth than the wide band signal, especially in those cases, such as military applications, where the major wide band signal is submerged in the ambient noise signals to provide a degree of covertness.

In order to have the wide band signal serve some useful purpose, it is desirable to remove the narrow band interfering signals therefrom. In many cases, however, the method used to remove the narrow band interference typically results in a severely distorted and thereby, useless output signal. Consequently, new and improved techniques are continuously sought for effecting this operation.

SUMMARY OF THE INVENTION

This invention relates to a network which uses serially connected adaptive filters which operate at the outputs of a plurality of bandpass filters in order to eliminate the narrow band noise and interference at that location while preserving the instantaneous wide band signals. In particular, the adaptive filter is a line enhancer which cancels out the narrow band noise and interference in one channel and, in turn, serially feeds the result to other adaptive filters which cancel out the interference in the remaining channels.

DESCRIPTION OF A PREFERRED EMBODIMENT

Figure 1:
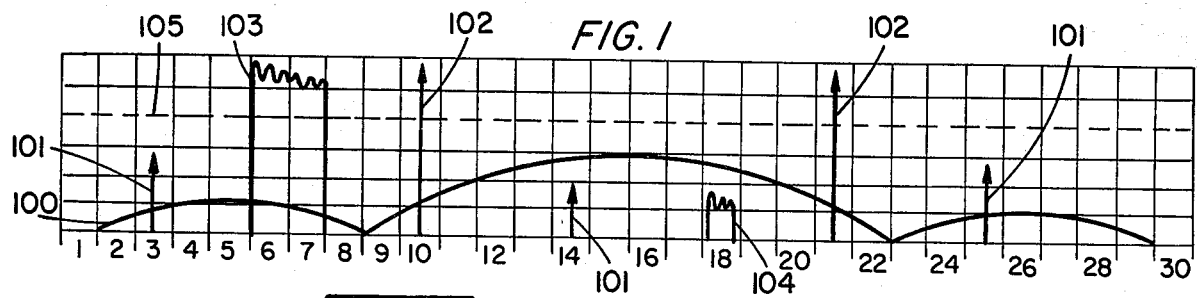
FIG. 1 is an amplitude spectral representation of a wide band signal with a plurality of interfering signals applied thereto.

Referring now to FIG. 1, there is shown a spectrum 100 of a wide band signal having the characteristics of a spread spectrum signal with a sinx/x envelope. This is just one example of a wide band signal. Several interfering-type signals 101, 102, 103 and 104 are shown which tend to distort the wide band signal. The signals 101 and 102 are shown as relatively narrow band signals such as might be produced by interference tones or jamming signals. The signals 101 are shown as existing below the noise level 105 while the signals 102 are shown to exist above the noise level. The wider band interference signals 103 and 104 are representative of signals which are generated by a radio transmitter or the like. The signal 103 is above the noise level 105 while the signal 104 is below the noise level. While not necessarily so limited, the wide band signal 100 is shown to have a magnitude which is less than the noise level indicated by dashed line 105. If the wide band signal 100 is received without an effort to reduce the interference signals 101, 102, 103, 104, the wide band signal would be of little or no value due to the distortion caused by the interference.

Figure 2:
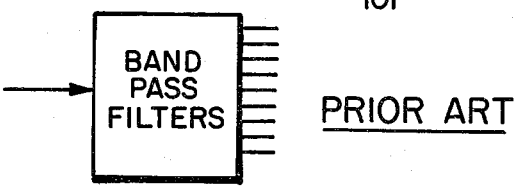
FIG. 2 is a schematic representation of a prior art method of removing the undesirable interfering signals shown in FIG. 1.

Referring now to FIG. 2, there is shown a schematic representative of a plurality of band pass filters which are used in the prior art. That is, the received signal, which includes the basic wide band signal 100 and the various interfering signals, is supplied as an input signal to the bandpass filters. In the illustrative example, thirty (30) bandpass filters are used. Each of these bandpass filters is selectively operable to pass or block a portion of the wide band signal. In order for an interference signal to be blocked, it must be detected in the presence of noise within a single bandpass filter. Signals 101 and 104 are too small to be detected and thus cannot be eliminated by the filter bank while signals 102 and 103 are large enough to be detected and can be eliminated. The thirty signal bands are represented in FIG. 1 by the base line numbers 1 through 30.

Typically, the total input signal is supplied to the bandpass filter network 200 shown in FIG. 2. Those bands where interference signals are detected, are passed through the appropriate bandpass filters. However, those bands in which an interfering signal is detected are blocked so that no signal passes through that filter. In this manner, all of the detected interfering signals are removed, but those that are undetected remain and cause distortion.

Figure 3:
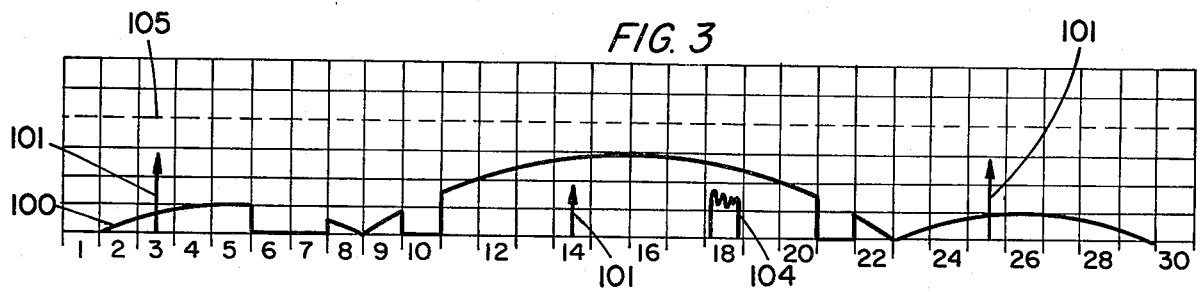
FIG. 3 is the amplitude spectral diagram of the wide band signal after the noise has been removed by the filter bank shown in FIG. 2.

However, referring to FIG. 3, by blocking these bands of signals with a relatively wideband pass filter and allowing the undetected interference to pass through, the ultimate output signal which is received is distorted. The signal 100 shown in FIG. 3 shows many large gaps. In the event that the gaps are sufficiently broad or sufficiently numerous, the signal 100 becomes essentially useless. While it might be possible to use a greater number of bandpass filters in network 200 (see FIG. 2) the output signal may still be distorted and the system would be more complex and costly.

Figure 4:
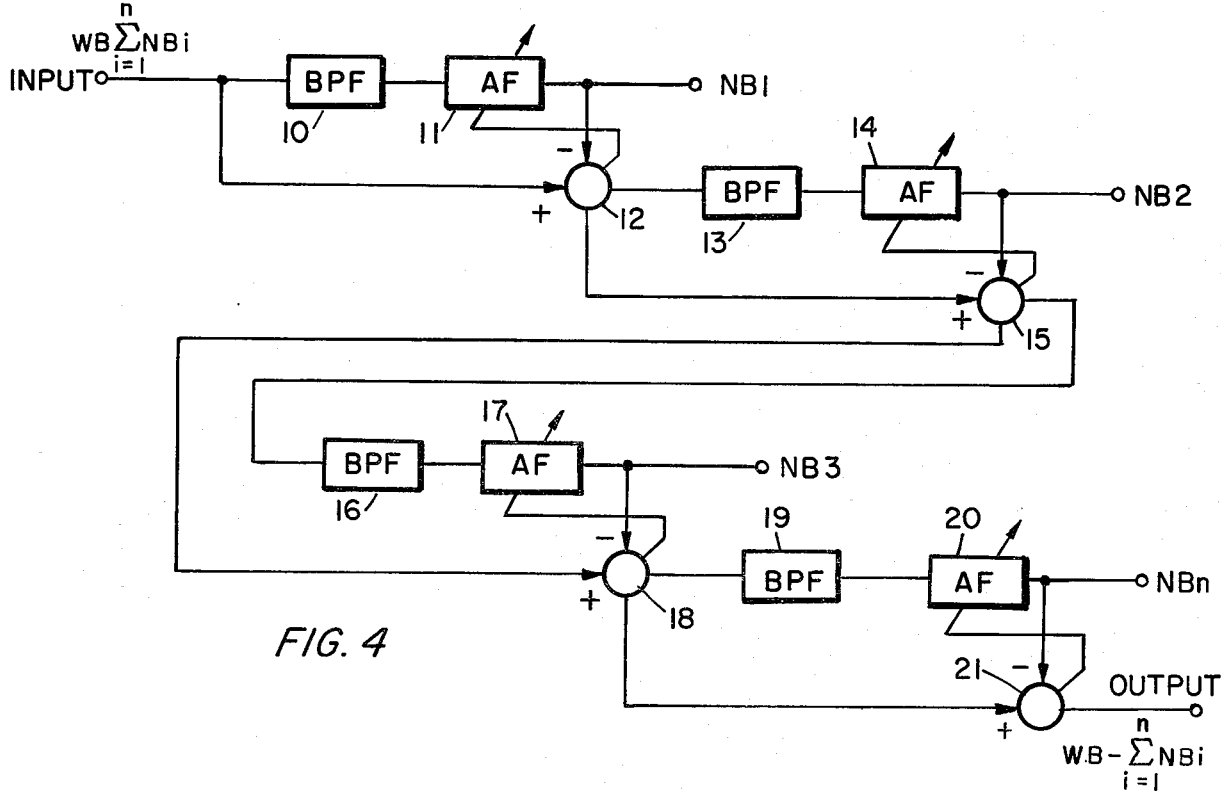
FIG. 4 is a block diagram of the network of the instant invention.

Referring now to FIG. 4, there is shown a channelized and serialized filter network or processor of the instant invention. In this network, the input signal is supplied to the input terminal which is connected to the input of a bandpass filter 10 and an input of a summing network 12. The output of bandpass filter 10 is connected to the input of an adaptive filter which may be of the type shown and described in the copending application, entitled MSE VARIABLE STEP ADAPTIVE FILTERS, by Richard W. Harris, Glen D. Rattlingourd and F. Avery Bishop, filed on July 1, 1982, bearing Ser. No. 394,488, and assigned to the common assignee. The output of the adaptive filter 11 is connected to a first output terminal NB1, as well as to another input terminal of summing network 12. The output of summing network 12 is applied to adaptive filter 11 to selectively alter the operational characteristics thereof so that the narrowband and wideband signals are separated more efficiently.

In addition, the output of summing network 12 is connected to an input of bandpass filter 13 and to an input of summing network 15. Bandpass filter 13 can be of similar nature to bandpass filter 10 but with a different center frequency. The output of filter 13 is connected to an input of adaptive filter 14 which is similar in nature to adaptive filter 11. The output of adaptive filter 14 is connected to the output terminal NB2, as well as to an input of summing network 15. Summing network 15 supplies a control signal to the adaptive filter 14 to alter the operating characteristics thereof as previously explained. Once again, the output of summing network is connected to an input of bandpass filter 16 which is similar to the other bandpass filters but with a different center frequency. Also, another output of summing network 15 is connected to an input of summing network 18.

It is clear that each of the stages in this channel includes a bandpass filter connected to an adaptive filter and that the output of the adaptive filter is connected to a summing network which is connected back to the adaptive filter thereby to alter the operating characteristics thereof.

Each of the adaptive filters also produces an output signal NB1 through NBn which is the narrow band interference from that particular stage. Thus, the interference signal can be detected, analyzed and operated on in any fashion desired.

In addition, it should be noted that the input signal which includes the original wide band signal plus any narrow band interference is serially cascaded through the circuit by being passed from one summing network to another. In particular, in the instance shown, the input signal is supplied to summing networks 12, 15, 18 and 21 in series. As the input signal is serially cascaded through summing networks 12, 15, 18 and 21, the respective NB signals within the bandpass filters 10, 13, 16 and 19 are subtracted from the composite input signal. Thus, as the original input signal is serially cascaded through the circuit, it becomes less and less corrupted by the NB interference signals.

Because of the nature of the adaptive filters to converge very precisely on the narrowband noise or interference portion of the signal, the output signals NB1 through NBn are quite closely aligned to the actual interfering signal. Moreover, this close accuracy on the interference signal assures that the signal portion which is subtracted from the originally supplied wideband signal by any or each of the summing networks is minimized.

Figure 5:
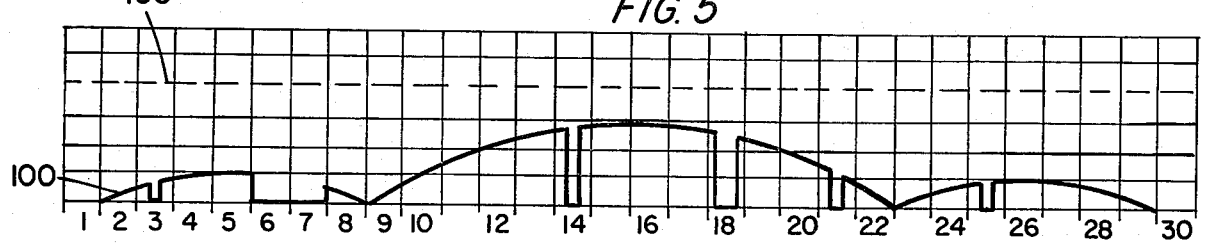
FIG. 5 is the amplitude spectral diagram of the output of the circuit shown in FIG. 4.

Consequently, referring to FIG. 5, there is shown the wideband signal 100 which is produced at the output terminal of the circuit shown in FIG. 4. This wide band signal has all of the interference signals subtracted therefrom. Of particular interest is the subtraction of those signals 101 and 104 which appear below the noise level 105. However, it is seen that with a relatively smaller number of bandpass filters, the output signal produced by the circuit can be much closer to the original signal. The adaptive filters used in the circuit of FIG. 4 permit the interfering signals to be "excised" with substantial accuracy so that little or no portion of the input signal is unnecessarily lost.

Thus, there is shown and described a unique filter network or processor which is especially useful in receiving and/or processing wide band signals so as to eliminate narrowband noise or interference while having minimal effect on the wide band signal. The illustrative description mentions a particular adaptive filter. Any number of adaptive filters can be used with this circuit. However, one of the most effective adaptive filter types to be used is the infinite impulse response (IIR) filter using the variable step algorithm described in the aforementiond co-pending patent application. This type of adaptive filter has been shown to be especially effective in accurately separating narrowband signals from wideband signals even in the presence of noise. It has also been shown to work even when some of the narrowband signals are buried in the noise as depicted in FIG. 1. The circuit shown and described in this invention has the distinct advantages that (1) the wideband signal remains substantially intact throughout the processing procedure; (2) the narrowband inteference signals are readily available for evaluation and interpretation; and (3) the adaptive filters are required to respond only to a narrowband bandwidth interference signal.

It is understood that those skilled in the art may conceive modifications to this system. However, any such modifications which fall within the purview of this description are intended to be included therein as well. This description is intended to be illustrative only and not limitative. The scope of the invention is limited only by the claims appended hereto.

Having thus described a preferred embodiment of the invention, what is claimed is:

1. A filter circuit system comprising,
    input means for supplying a wideband signal which contains undesirable narrowband signal components,
    bandpass filter means connected to said input means,
    adaptive filter means connected to receive signals from said bandpass filter means, and
    summing means connected to sum said input signal and the signal produced by said adaptive filter means and to produce a control signal which is applied to said adaptive filter means to control the operation thereof.

2. The system recited in claim 1 including,
    second bandpass filter means connected to receive the output signal from said summing means,
    second adaptive filter means connected to receive signals from said second bandpass filter means, and
    second summing means connected to sum the output signals from said first summing means and said second adaptive filter means and to produce a second control signal which is applied to said second adaptive filter means to control the operation thereof.

3. The system recited in claim 2 wherein,
    said bandpass filter means and said second bandpass filter means each have different bandpass characteristics.

4. The system recited in claim 1 wherein,
    said adaptive filter means has a variable scaling factor.

5. The system recited in claim 1 wherein, said adaptive filter means produces a narrowband output signal relative to said wideband signal.

6. A method of separating wideband signals from narrowband signals wherein, a combined signal including wideband and narrowband signal components is supplied to at least one summing apparatus, said combined signal is supplied to a bandpass filter and an adaptive filter series combination to produce a first narrowband signal, and said first narrowband signal is algebraically summed with said combined signal at said summing apparatus.

7. The method recited in claim 6 wherein, said algebraic summing effects an accurate subtraction of said narrowband signals from the combined signal.

8. The method of separating narrowband signals from wideband signals by passing the wideband signal through a plurality of serially cascaded adaptive filters which filters individually operate upon the narrowband signals such that the filters collectively separate the narrowband signals from the wideband signal while leaving the wideband entirely intact.

* * * * *